United States Patent [19]

Fossum et al.

[11] Patent Number: 5,055,900
[45] Date of Patent: Oct. 8, 1991

[54] TRENCH-DEFINED CHARGE-COUPLED DEVICE

[75] Inventors: Eric R. Fossum; Sabrina E. Kemeny, both of New York, N.Y.

[73] Assignee: The Trustees of Columbia University in the City of New York, New York, N.Y.

[21] Appl. No.: 419,904

[22] Filed: Oct. 11, 1989

[51] Int. Cl.$^5$ .................... H01L 29/78; H01L 29/06; G11C 19/28
[52] U.S. Cl. ......................... 357/24; 377/60; 357/55
[58] Field of Search ................. 357/24, 55; 377/57-63

[56] References Cited

U.S. PATENT DOCUMENTS

| | | | |
|---|---|---|---|
| 3,848,328 | 11/1974 | Ando et al. | 357/55 |
| 4,032,952 | 6/1977 | Ohba et al. | 357/24 M |
| 4,488,163 | 12/1984 | Bluzer et al. | |
| 4,527,183 | 7/1985 | Anthony et al. | |
| 4,760,273 | 7/1988 | Kimata | |
| 4,926,225 | 5/1990 | Hosack | 357/24 LR |

FOREIGN PATENT DOCUMENTS

| | | | |
|---|---|---|---|
| 37200 | 10/1981 | European Pat. Off. | 357/24 M |
| 2842649 | 5/1980 | Fed. Rep. of Germany | 357/24 M |
| 52-6473 | 1/1977 | Japan | 357/24 M |
| 60-198771 | 10/1985 | Japan | |
| 62-290175 | 12/1987 | Japan | 357/24 M |

OTHER PUBLICATIONS

W. F. Richardson et al., "A Trench Transistor Cross-Point Cell", IEDM85, pp. 714-717, 1985.
T. Yamada et al., "Trench CCD Image Sensor", IEEE Transactions on Consumer Electronics, vol. 35, No. 3, Aug. 1989.
Fossum "A Novel Trench-Defined MISM CCD Structure ... " IEEE Electron Device Letters, vol. 10 (5/89) 3 p.

Primary Examiner—Gene M. Munson
Attorney, Agent, or Firm—Brumbaugh, Graves, Donohue & Raymond

[57] ABSTRACT

A charge-coupled device (CCD) is formed by first defining relatively deep trenches having relatively small lateral dimensions in the surface of a silicon bulk region. A relatively thin silicon dioxide layer is formed over the silicon surface and inside each trench to cover the internal surfaces thereof. Finally, respective conducting electrode layers are formed over each trench covering the silicon dioxide layer within the trench. Such a CCD structure provides improved packing density and versatility of function over a conventional surface electrode CCD structures. When used in an image-sensing device, the trench-defined CCD structure provides improved quantum efficiency, owing to the deeper potential wells which may be formed in such structures for capturing photogenerated charge carriers.

9 Claims, 8 Drawing Sheets

TRENCH-DEFINED CHARGE-COUPLED DEVICE

BACKGROUND OF THE INVENTION

The present invention relates to charge-coupled devices and, more particularly, to a charge-coupled device structure providing improved packing density on a semiconductor chip, and improved performance when used to implement an image sensor and other functions.

In a conventional charge-coupled device (CCD) individual electrodes are typically disposed in linear arrays over a semiconductor surface and separated from the surface by a thin insulating layer. Applying a particular pattern of voltages to the electrodes defines charge storage regions in the form of potential wells in the semiconductor body below the surface. Each such charge storage region is capable of storing a discrete packet of charge which may vary in magnitude. By appropriately changing voltages applied to the electrodes to modify the configuration of the potential wells, the discrete charge packets stored at each charge storage region may be shifted along a linear array into other linear arrays or detected and converted into current or voltage signals at one end of the array. In this manner a linear array of electrodes is operated as a shift register.

Each electrode of a CCD may be thought of as defining a metal-insulator-semiconductor (MIS) capacitor. Depending upon the configuration of impurity regions in the semiconductor body beneath the surface on which the electrodes are formed, the potential wells serving as charge storage regions may either be adjacent to the semiconductor surface or confined below the surface. Devices of the latter type are referred to as "buried-channel" CCDs. The charge is stored in both cases in a sheet-like region parallel to the surface.

A common application of CCDs is in solid-state image sensors. A typical CCD image sensor comprises a two-dimensional array of electrodes formed above a silicon surface and separated from the surface by a thin layer of silicon dioxide. Typically, a buried-channel CCD configuration is used to minimize charge loss due to surface traps.

By applying an appropriate pattern of voltages to the electrodes, a regular array of charge storage regions is established for an exposure interval. During such an interval, charge generated by light impinging in or near each charge storage region is accumulated within the region. Each charge storage region corresponds to a picture element (pixel) of the image sensor, and the charge stored in such region is representative of the light intensity at the corresponding pixel.

Subsequently, during a scanning interval, which is normally much shorter than the exposure interval, the voltages applied to the electrodes are appropriately varied to rapidly shift the charge packets in each charge storage region accumulated during the exposure interval to a particular edge of the array. Typically, charge packets corresponding to the pixels are moved, one row at a time, into respective charge storage regions of an edge-positioned CCD shift register, which provides the charge packets corresponding to successive rows of pixels in serial form. Image sensors using CCDs are in widespread use in video cameras and other imaging devices.

The total semiconductor area covered by an electrode of a CCD determines the size of the charge storage region associated with the electrode, and hence the amount of charge that may be stored in such a region. Although present day integrated circuit fabrication processes can provide electrodes having an area of less than $1\mu^2$, signal-to-noise and dynamic range considerations associated with detecting shall charge packets impose a practical limitation on the minimum area of the electrode, which is generally larger than that imposed by the fabrication process. In conventional CCDs where the electrodes are formed entirely on the planar surface of the semiconductor body, the number of electrodes which may be formed in a given surface area (i.e., the packing density) is limited by the minimum area of the electrode, as determined by signal-to-noise and dynamic range considerations. Therefore, the maximum packing density achievable with conventional CCDs is typically less than that which is permitted by the fabrication process. In the case of a CCD image sensor, a limitation on packing density gives rise to a limitation on the resolution of the image sensor for a given area.

Image sensors using conventional CCDs tend to have a low quantum efficiency in the X-ray and far infrared regions of the spectrum, because of the relatively shallow dimension of the charge storage regions in such devices and the relatively small absorption cross sections for photons in those regions of the spectrum. The poor performance of solid-state, X-ray image sensors formed with conventional CCD structures is described in greater detail in the following published papers: Bautz, M. W. et al., "Charge-coupled-device X-ray detector performance model", Optical Engineering, August 1987, p. 757, and Lumb, David H., et al., "X-ray Measurements of Charge Diffusion Effects in EEV Ltd. Charge-Coupled Devices", Optical Engineering, August 1987, p. 773.

One technique which has been used to improve the performance of solid-state X-ray image sensors using conventional CCD structure is to apply a phosphor on the light-receiving surface of the image sensor which converts X-ray photons into photons of an energy for which the semiconductor material has a higher absorption cross section. However, this technique has not been shown to provide an adequate increase in the overall quantum efficiency of the sensor.

Another technique for improving the performance of surface electrode CCD X-ray Image sensors is to use high-resistivity silicon to provide deeper charge storage regions providing a longer path length for the absorption of an X-ray photon. But CCDs are difficult to fabricate using high resistivity material, because certain contaminants unavoidably introduced during processing tend to lower the resistivity of the semiconductor material. Furthermore, the signal voltage levels required to operate a CCD fabricated with high resistivity material becomes quite high, i.e., on the order of 100 volts.

The use of other semiconductor materials such as gallium arsenide having higher absorption cross sections for X-ray photons has been proposed. However, the fabrication of CCDs with such materials has proven to be difficult.

It is apparent from the foregoing that a need exists for a CCD structure which provides higher packing density on a semiconductor chip. Furthermore, a need exists for a solid-state image sensor having improved quantum efficiency in the X-ray and far infrared regions of the spectrum.

SUMMARY OF THE INVENTION

In accordance with the invention, a novel trench-defined CCD structure is used to implement a variety of device functions. Unlike the relatively wide sheet-like charge storage regions of known surface electrode CCD structures, the charge storage regions of the CCD structures in accordance with the invention are deep and have small lateral dimensions, as a result of electrodes defined by trenches which extend relatively deep into the semiconductor around the relatively deep trenches, a longer path length for the photogeneration of carriers is obtained, which improves the quantum efficiency in image sensing applications. Since the electrodes may have small lateral dimensions and will provide relatively high capacity charge storage regions, the CCD structure in accordance with the present invention may be packed more densely than conventional CCD structures.

Used in an image sensor, the trench-defined CCD structure offers higher quantum efficiency, particularly in the X-ray and far-infrared regions of the spectrum, without the need for higher operating voltages, as in some known CCD structures. The trench-defined CCD structure in accordance with the invention also offers improved packing density on a chip, and therefore higher resolution in image sensing devices.

BRIEF DESCRIPTION OF THE DRAWING

The present invention may be better understood with reference to the following detailed description of exemplary embodiments thereof, taken in conjunction with the figures of the drawing in which.

Throughout the figures of the drawings, the same reference character or numerals are used to denote like regions, parts or components of the disclosed apparatus.

DETAILED DESCRIPTION OF AN EXEMPLARY EMBODIMENT

Figure 1A:
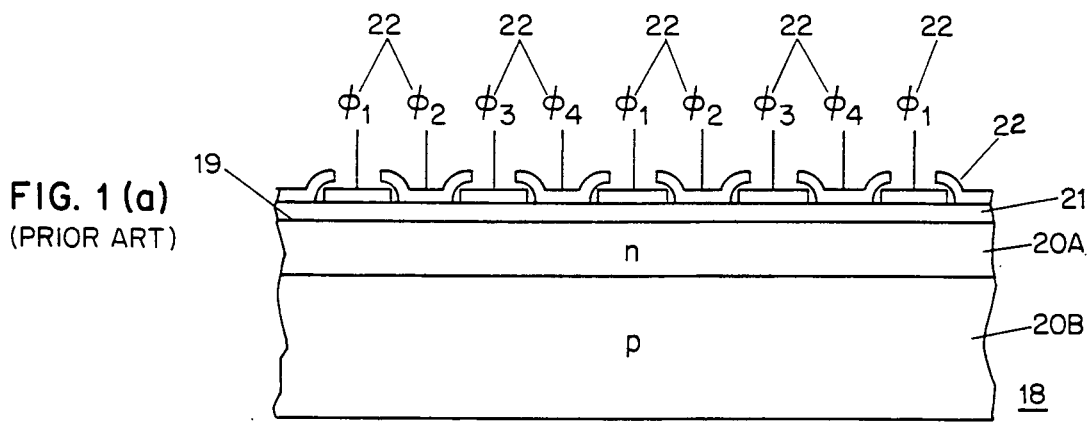
FIG. 1(a) is a cross-sectional view of a conventional linear array CCD structure for four-phase operation.
Figure 1B:
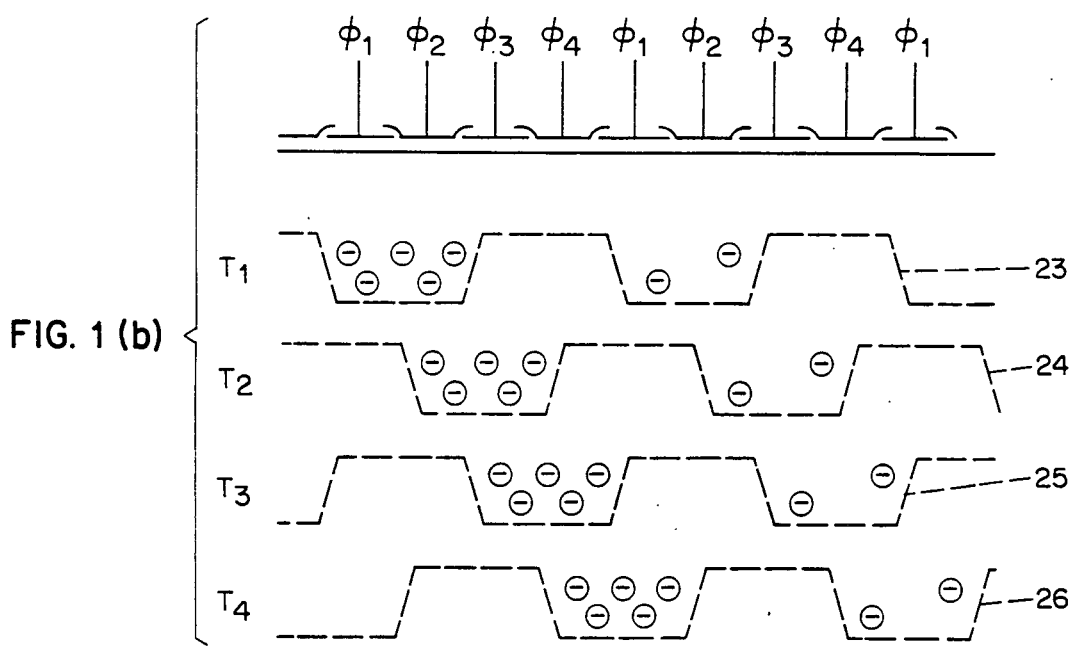
FIG. 1(b) illustrates the charge storage regions (potential wells) formed by four different voltage patterns corresponding to the four signal phases applied to the electrodes of the device illustrated in FIG. 1(a)
Figure 1C:
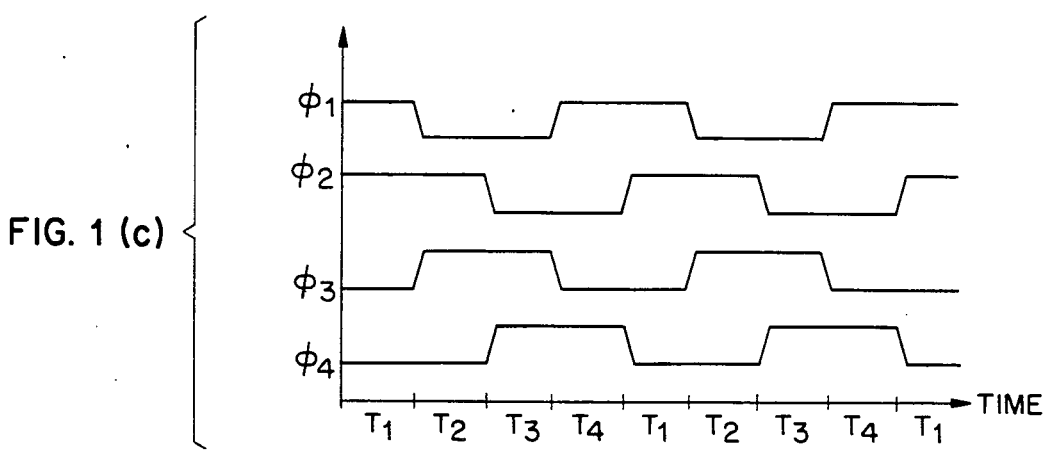
FIG. 1(c) shows the timing diagrams of the four-phase voltage signals which when applied to the electrodes of the CCD of FIG. 1(a) results in the charge storage region configurations illustrated in FIG. 1(b)

Referring to FIG. 1(a), which illustrates in cross-sectional view a known CCD structure 18, a plurality of electrodes 22 are formed above a major surface 19 of an n-type epitaxial silicon layer 20A formed on a p-type silicon substrate 20B. The electrodes 22 are separated from the major surface of the silicon body by a relatively thin layer of silicon dioxide 21. During operation of the device 18, a time-varying voltage pattern is applied to the electrodes 22 as provided by four signal phases $\phi_1$, $\phi_2$, $\phi_3$, and $\phi_4$. The wave forms of the signal phases $\phi_1$, $\phi_2$, $\phi_3$, and $\phi_4$ are illustrated in FIG. 1(c). FIG. 1(b) depicts the potential well configurations 23, 24, 25 and 26 which are induced in the silicon body 20A by the voltage patterns on the electrodes 22 at times t1, t2, t3 and t4, respectively. At time t1 the potential wells are shown as storing charge packets of different magnitudes. As the voltage pattern applied to the electrodes 22 is varied, at times t2, t3 and t4 the charge packets in the potential wells are shifted by one position each time to the right of the figure. In this manner, the device of FIG. 1(a) is operated as a shift register, in which every four electrodes define a shift register stage. Since a four-phase signal is required to produce the voltage patterns to shift the charge packets, the operation described for the device of FIG. 1(a) is referred to as four-phase operation.

Figure 2:
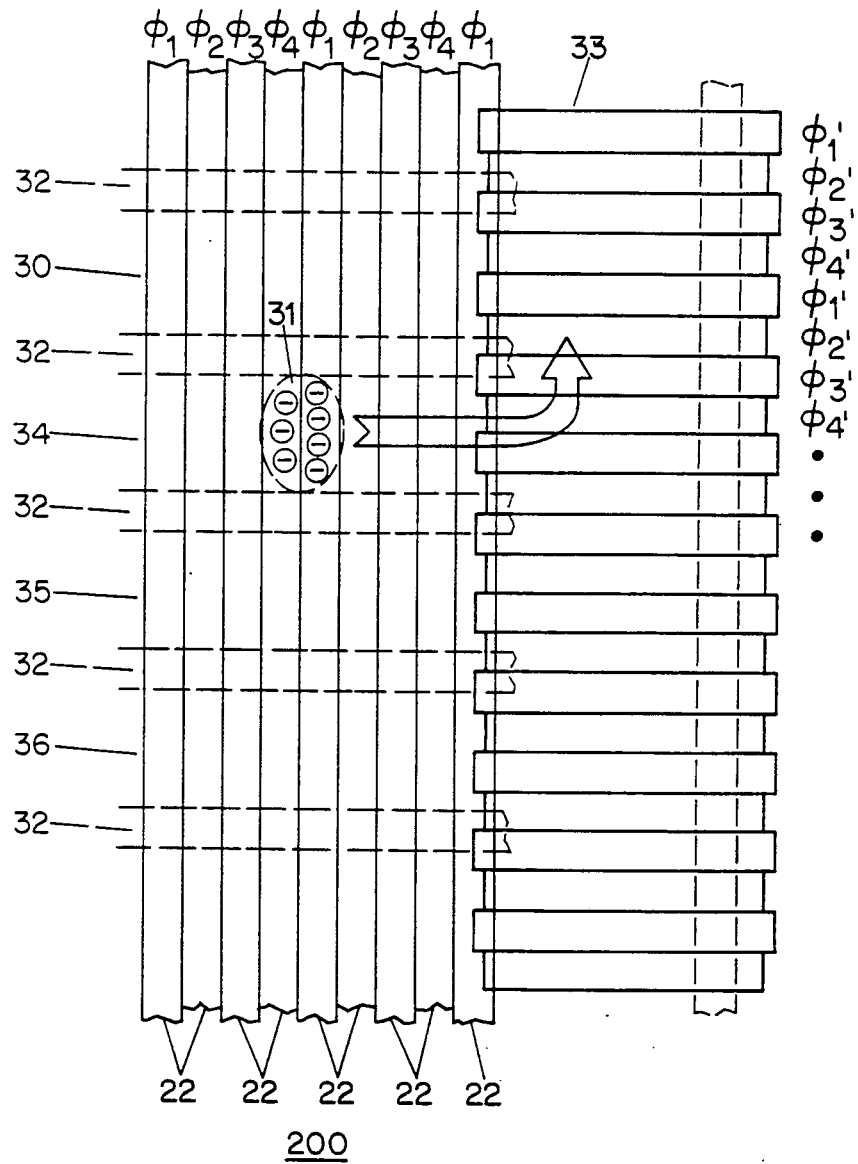
FIG. 2 is a plan view of an image sensor implemented with a conventional CCD structure for four-phase operation.

Referring now to FIG. 2 there is shown a known image sensor 200 implemented with the CCD structure of FIG. 1(a). An array of charge storage regions is established by four shift registers 30, 34, 35, and 36, each having the structure shown in FIGS. 1(a). The eight electrodes 22 are common to all four shift registers 30, 34, 35, and 36. The charge packets 31 are confined to their respective shift registers by p+ barriers 32 formed in the surface of the silicon body.

After each exposure interval, during which charge packets having a magnitude representative of the light intensity at each charge storage region corresponding to a pixel is accumulated, a four-phase voltage signal is applied to the electrodes during the scanning interval to shift the array of charge packets accumulated during the exposure interval one position at a time to the right. A shift register 33 receives and serializes each row of charge packets from the shift registers 30, 34, 35 and 36 for detection and processing by means not shown in FIG. 2.

Figure 3A:
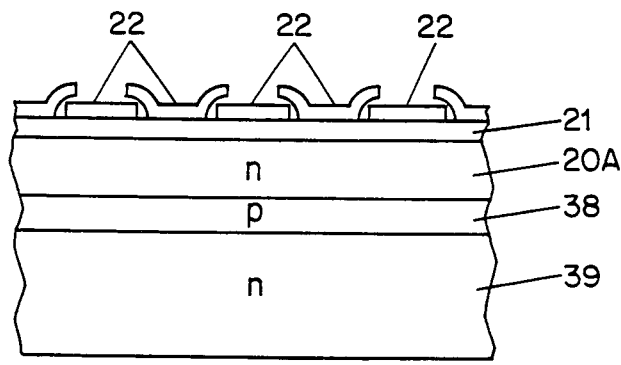
FIG. 3(a) is a cross-sectional view of a prior art CCD structure with a vertical overflow drain structure designed into the material layer structure.
Figure 3B:
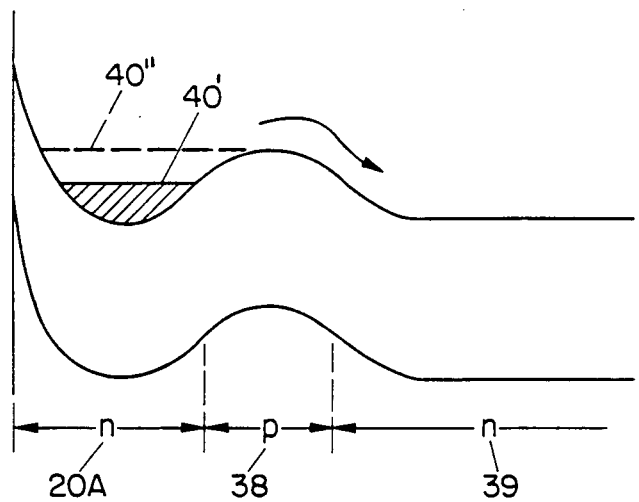
FIG. 3(b) is a diagrammatical illustration of the electrostatic potential along the vertical direction, as seen by charge carriers, in the CCD structure of FIG. 3(a)

Turning now to FIGS. 3(a) and 3(b), there is shown a cross-sectional view of the CCD structure of FIG. 1(a) modified for the purpose of forming a vertical overflow drain. The p-n junction formed by layers 38 and 39 are biased to fully deplete the p region 38. In this manner, charge stored in the upper n-region 20A will flow outward to the substrate 39 if the magnitude of the charge in the CCD channel exceeds a certain value. As illustrated in FIG. 3(b) a quantity of charge having a magnitude represented by region 40' will be retained in the CCD channel, but a quantity of charge having a magnitude larger than that representing region 40' will "overflow" into the layer 39. Such a vertical overflow drain prevents a condition known as blooming in CCD image sensor, which causes deterioration of the image quality.

Figure 4A:
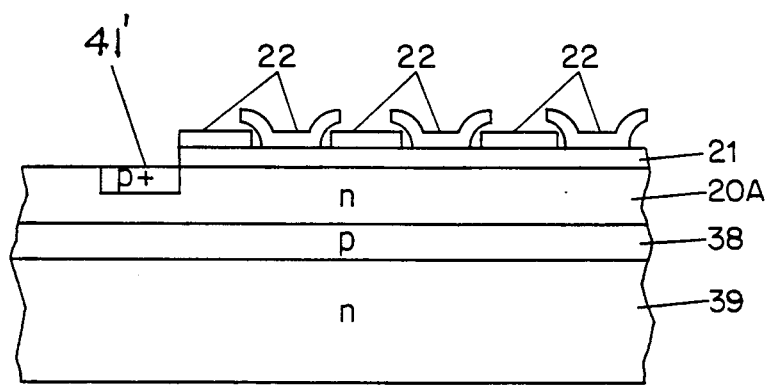
FIG. 4(a) is a cross-sectional view of a prior art CCD structure containing both a vertical overflow drain material layer structure and an inverting channel contact for reduction of surface dark current.
Figure 4B:
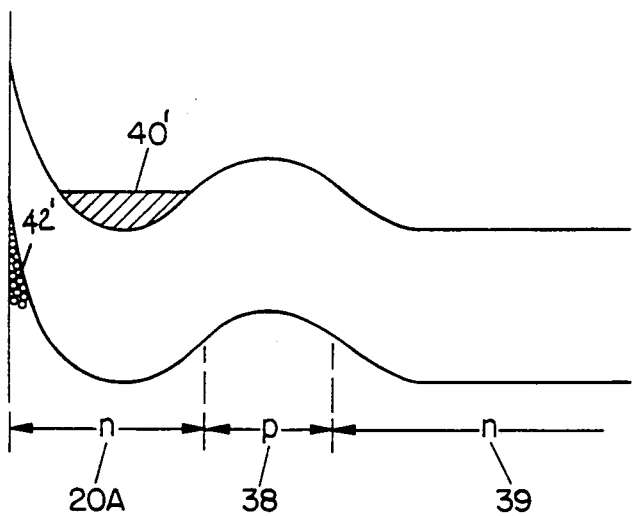
FIG. 4(b) is a diagrammatical illustration of the electrostatic potential along the vertical direction in the CCD structure of FIG. 4(a), showing the effect of the presence of an inverting charge layer at the semiconductor surface with the addition of the inverting channel contact.

In FIG. 4(a) an inverting contact realized as a relatively heavily doped p-type region, 41', has been added to the surface of the semiconductor to the CCD structure of FIG. 3(a). This p+ region is biased so as to cause holes 42' to flow to the surface of the semiconductor, as shown in FIG. 4(b). In a CCD image sensor, the removal of holes by the inverting contact 41' reduces the dark current produced at the silicon-silicon dioxide interface and thereby improves image quality. Such an inverting contact 41' is biased to automatically cut-off during charge-transfer so as not to interfere with the electrostatic potentials required to achieve good charge transfer efficiency.

Figure 5A:
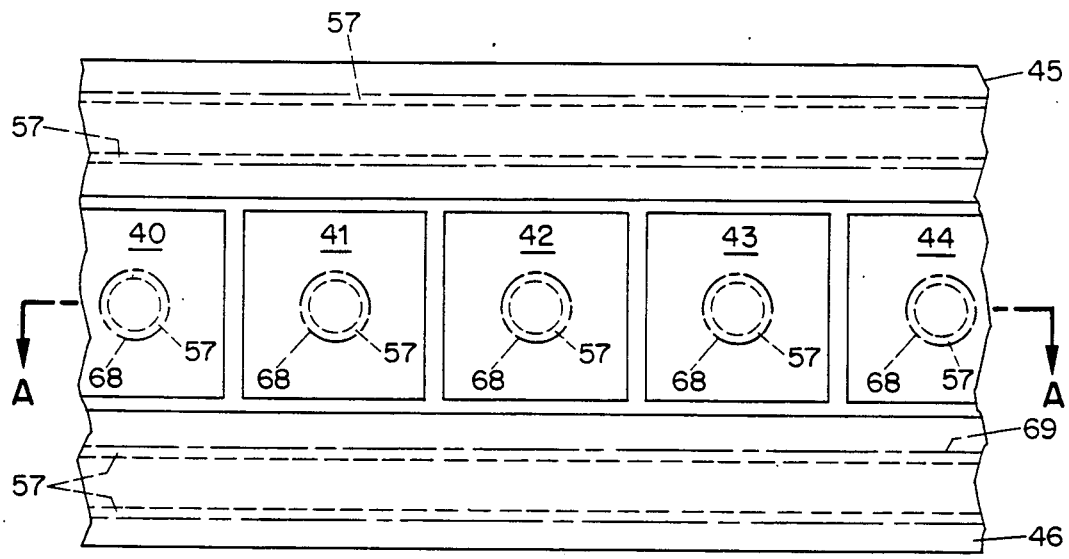
FIG. 5(a) is a plan view of a linear array trench-defined CCD structure for four-phase operation in accordance with the present invention.
Figure 5B:
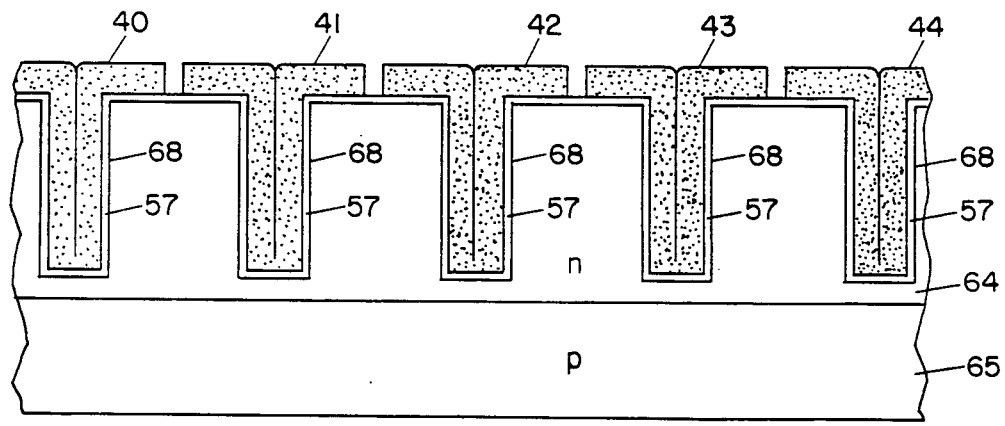
FIG. 5(b) is a cross-sectional view of the CCD structure of FIG. 5(a) along section line A—A.

Turning now to FIGS. 5(a) and 5(b), there are shown a plan view and a cross-sectional view, respectively, of a portion of a linear-array, trench-defined CCD structure in accordance with the invention. The cross-sectional view of FIG. 5(b) is taken along line A—A of FIG. 5(a).

An n-type epitaxial silicon layer 64 doped with phosphorus at a concentration on the order of $10^{15}$ per $cm^3$ is formed over a P-type silicon substrate 65 doped with boron at a concentration on the order of $10^{17}$ per $cm^3$. A row of regularly spaced apart holes or trenches 68 are formed in the surface of the n-type layer 64 using conventional photolithography, masking, and reactive ion etching techniques. Using the same techniques, long trenches 69 on each side of the row of holes are simultaneously formed. All trenches 68 extend into the n-type layer 64 to a depth that is relatively close to the boundary with the p-type substrate 65 below. In the present example, the trenches 68 have approximately straight side walls with a trench width or diameter of approximately 1 to 1.5 microns. Following the formation of the trenches 68, a silicon dioxide layer 57 having a thickness of 500 to 800 Angstroms is formed on the surface of the n-type layer 64 in the same manner as the thin silicon dioxide layer in conventional CCD structures. The silicon dioxide layer 57 extends into each trench, covering the side and bottom walls therein.

A layer of polysilicon, doped with phosphorus at a concentration on the order of $10^{19}$ per $cm^3$, is formed over the silicon dioxide layer 57 and is patterned by conventional photolithography and etching techniques to form individual electrodes 40-44, 45 and 46 overlapping each one of the trenches 68 and 69. The electrodes 40-44 extend into respective trenches to be in contact with and completely cover the silicon dioxide layer 57 therein.

The depth of the trenches 68 and 69 is chosen such that the p-n junction between layers 64 and 65 falls within the depletion region created when the device is biased during use in the manner described below. The thickness of the n-type layer 64 is chosen to be about 20 microns for most applications. In the case of image sensors for applications in the x-ray or infrared regions of the spectrum, the thickness of the n-type layer 64 is advantageously chosen to be in the range of 100 to 200 microns for improved quantum efficiency of the sensor.

Figure 6A:
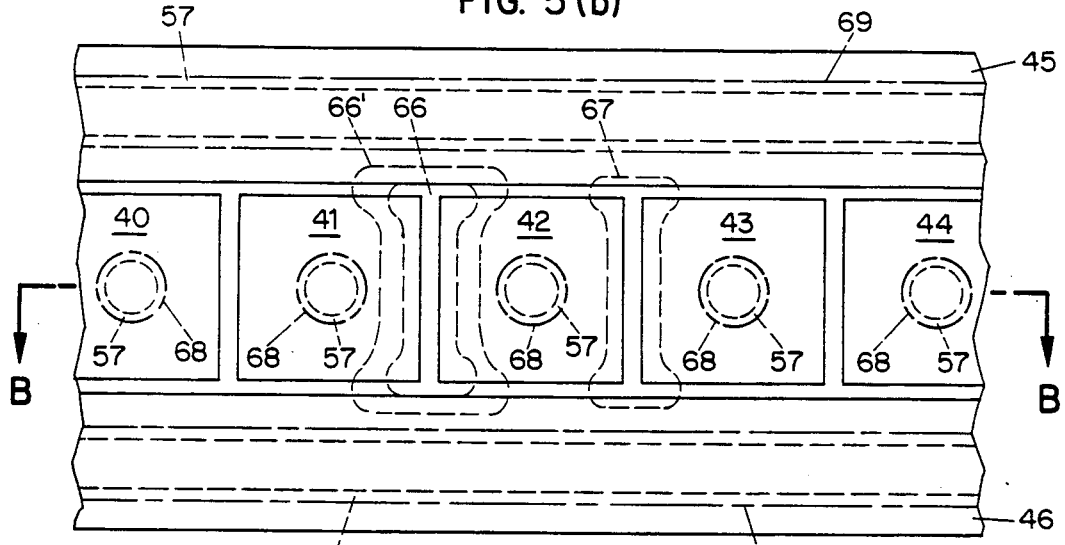
FIG. 6(a) is a plan view of the CCD structure of FIG. 5(a) illustrating charge storage regions defined by adjacent electrodes.
Figure 6B:
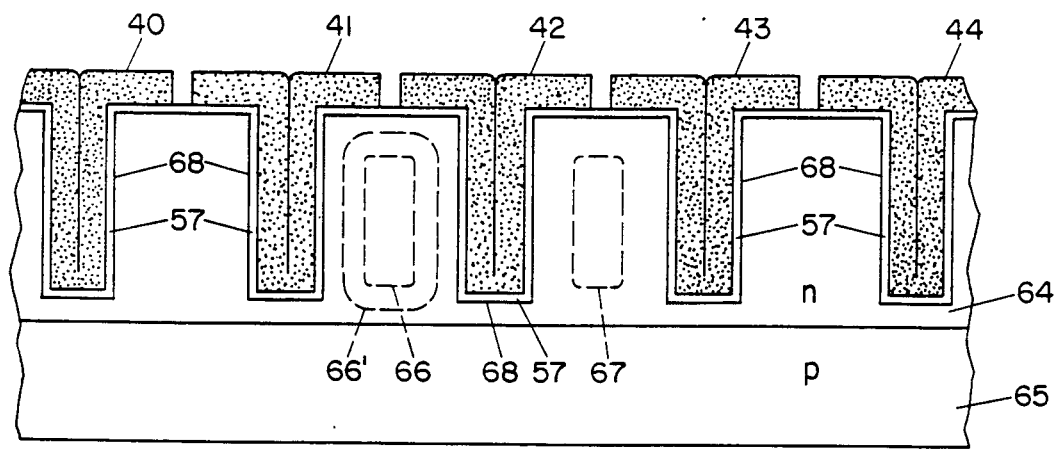
FIG. 6(b) is a cross-sectional view of the CCD structure of FIG. 6(a) along section B—B showing charge storage regions defined by adjacent electrodes.

FIGS. 6(a) and 6(b) show a charge storage regions 66 (or 66') created in the CCD structure of FIGS. 5(a) and 5(b) when appropriate voltage patterns are applied to the electrodes 40-44. The charge storage region 66 (or 66'), which is surrounded by electrodes 41, 42, 45 and 46, may be achieved by applying a charge-retention voltage of approximately 2.5 V to electrodes 41, 42, 45 and 46 and a charge-repulsion voltage of approximately −2.5 V to electrodes 40 and 43, and 44. The charge storage region 66 (or 66') created by such a voltage pattern will vary in size in proportion with the amount of charge accumulated in such a region. For a relatively small amount of charge, this region is denoted by reference numeral 66, and for a relatively large amount of charge, the region is denoted by reference numeral 66', as shown in FIGS. 6(a) and 6(b).

A charge packet stored in region 66 (or 66') may be shifted in a selected direction by varying the voltage pattern applied to two of the four electrodes 41 and 42 surrounding the charge packet, and to the adjacent electrode in the selected direction. For example, to move the charge from region 66 to the right, electrodes 43 is brought to the charge-retention voltage and electrode 41 is brought to the charge-repulsion voltage. The result is that the charge packet moves from region 66 to region 67.

Four phases of shifting pulses, as exemplified by those shown in FIG. 1(c), may be employed to repeatedly shift charge packets to the left or to the right in FIGS. 6(a) and 6(b). Applying the voltage signals of FIG. 1(c) in the reverse pattern causes repetitive shifting of charge packets to the left. The movement of charge packets in the CCD structure of FIGS. 6(a) and 6(b) caused by the application of the signal phases $\phi_1$, $\phi_2$, $\phi_3$ and $\phi_4$ of FIG. 1(c) to the electrodes 40-44, respectively, is depicted diagrammatically in FIG. 1(b).

It is noted that the packing density of electrodes in a trench-defined CCD structure according to the invention is greater than that which can be achieved with conventional surface-electrode CCD structures. Owing to the vertical extension of the charge storage region, adequate charge storage capacity may be achieved with electrodes having lateral dimensions at or close to the minimum allowed by the design rules of the fabrication process. A storage cell in FIG. 6(a) extends, for example, from the right edge of the trench 68 associated with electrode 41 to the left edge of the trench 68 associated with electrode 42, a distance of perhaps 4 to 6 microns with present day technology. In the case of image sensors implemented with trench-defined CCDs in accordance with the invention, the thickness of the n-type layer 64 may be 100 to 200 microns, with the trench holes extending nearly the entire thickness. The greater vertical extent of the resultant charge storage region improves quantum efficiency of the sensor, due to the increased photon absorption path length within a charge storage region.

Figure 7A:
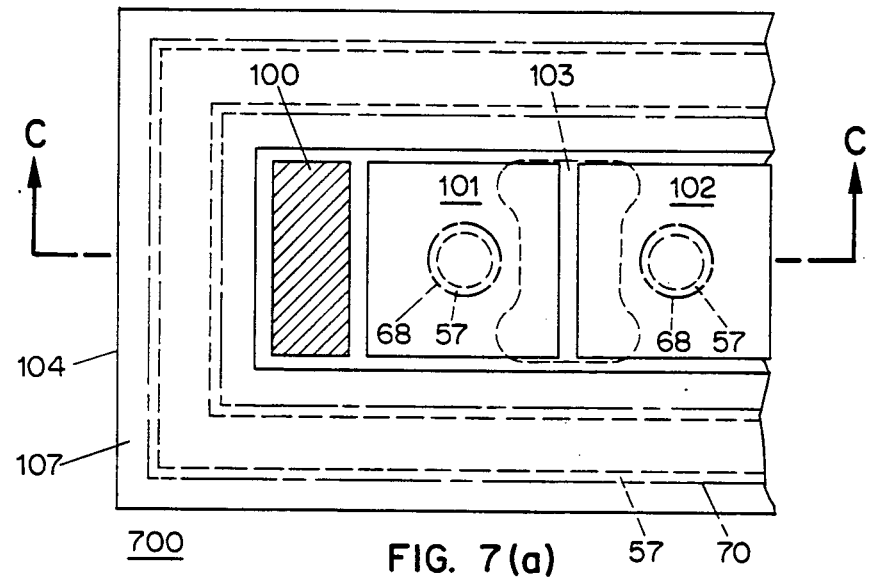
FIG. 7(a) is a plan view of an exemplary trench-defined charge source in accordance with the present invention.
Figure 7B:
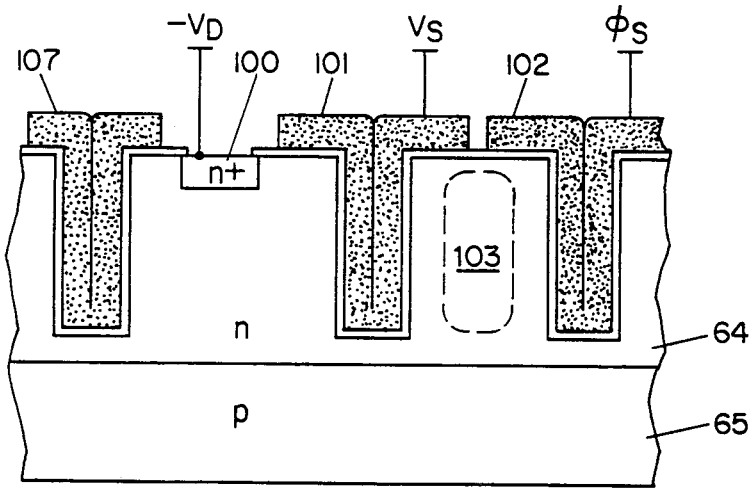
FIG. 7(b) is a cross-sectional view of a trench-defined charge source of FIG. 7(a) along section C—C.

An exemplary charge source 700 and charge detector 800 implemented with the trench-defined CCD structures in accordance with the invention will now be described. Turning to FIGS. 7(a) and 7(b), in the exemplary charge source 700 an n-type injection region 100, doped with phosphorus to a concentration in the range of $10^{18}$ to $10^{19}$ per cm$^3$, provides for the injection of signal charge into a charge storage region 103. As shown in FIG. 7(b), the injection region 100 is biased more negatively ($-V_D$) than the potential of the n-type layer 64, which in the example is biased at ground potential by means not shown, to cause injection of the signal charge into the n-type layer 64. The injection region 100 may be formed by conventional masked diffusion or ion implantation techniques. The magnitude of the injected signal charge may be modulated by an appropriate signal source Vs applied to a trench-defined electrode 101 positioned adjacent to the injection region 100. Another trench-defined electrode 102 positioned adjacent electrode 101 is normally biased at an appropriate negative voltage by a gate signal $V_s$ to form the charge storage region 103 for confinement of the signal charge. A trench-defined, surrounding isolation electrode 104 encloses injection region 100 and electrodes 101 and 102, and when biased at an appropriately negative voltage (e.g., $-10$ V), provides charge isolation of the injection region 100 and the electrode 101 from other parts of the CCD structure (not shown). When the electrode 102 is biased positively by the gate signal $\phi_s$, the signal charge may be transferred out of the charge source 700 into an appropriately situated charge storage region of a CCD structure (not shown) external to the charge source.

Figure 8A:
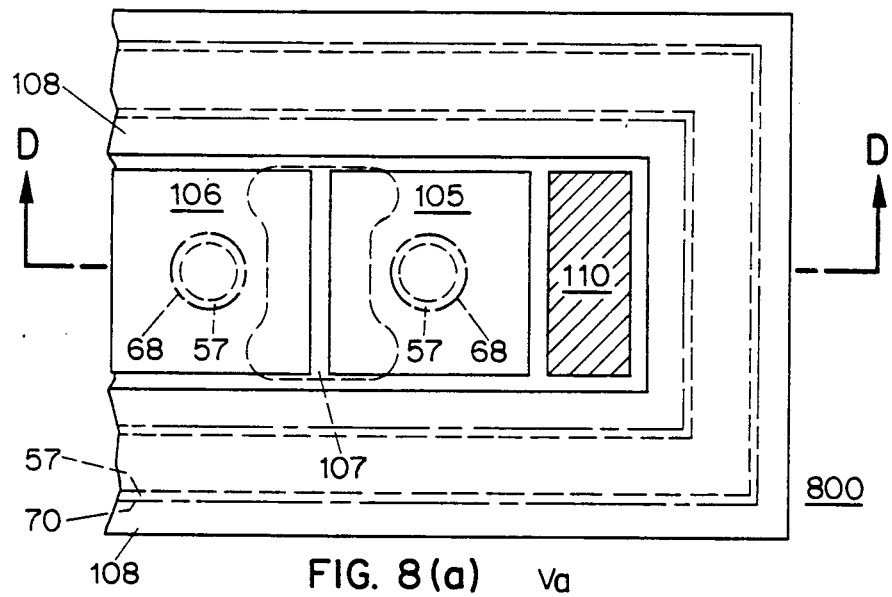
FIG. 8(a) is an exemplary plan view of a trench-defined charge detector in accordance with the present invention.
Figure 8B:
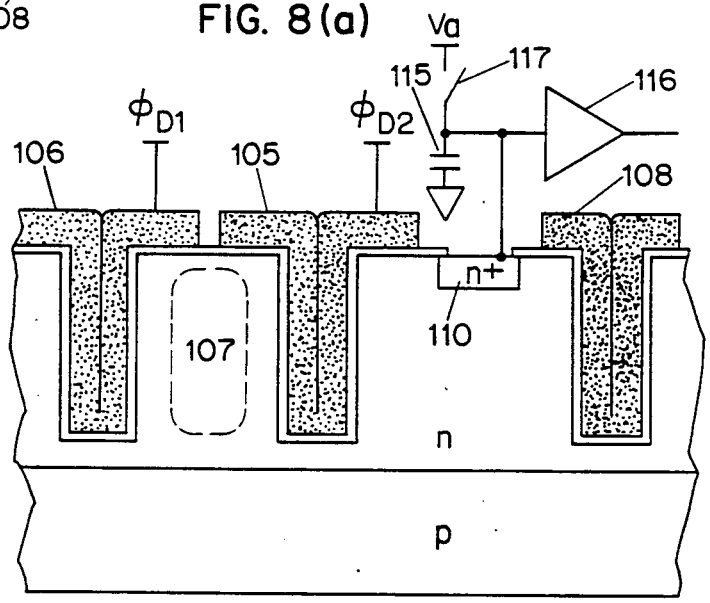
FIG. 8(b) is a cross-sectional view of a trench-defined charge detector of FIG. 8(a) along section D—D.

Turning to FIGS. 8(a) and 8(b), in the exemplary charge detector 800 an n-type detection region 110, doped with phosphorus to a concentration in the range of $10^{18}$ to $10^{19}$ per cm$^3$, provides for the extraction of charge from n-type layer 64 surrounding the detection region 110. As shown in FIG. 6(b), the detection region 110 is biased more positively than the potential of the n-type layer 64 by a dc voltage $V_a$ to cause extraction of charge from the n-type layer 64 by the detection region 110. A capacitor 115, reset switch 117 and an amplifier 116 converts the charge extracted by the detection region 110 to a voltage signal. The detection region 110 may be formed by conventional masked diffusion or ion implantation techniques. A trench-defined, surrounding isolation electrode 108, which when negatively biased (e.g., $-10$ V), provides isolation of the detection region 110 from other parts of the CCD structure (not shown). A pair of adjacent trench-defined electrodes 105 and 106, which are also enclosed by the surrounding isolation electrode 108, receive detector gating signals $\phi_{d1}$ and $\phi_{d2}$, respectively. When the electrodes 105 and 106 are biased at appropriately negative voltages, a charge storage region 107 is defined in the n-type layer region surrounded by the trenches 68 and 70 associated with the electrodes 105, 106 and 108. When the electrode 106 is biased at an appropriate positive voltage charge from an appropriate charge storage region of a CCD structure (not shown) external to the charge detector 700 may be transferred to the charge storage region 107. When the electrode 105, which is adjacent to the detection region 110, is biased positively with respect to the isolation electrode 108, a charge packet stored in the charge storage region 107 may be extracted by the detection region 110.

It is noted that the above-described exemplary charge source 700 and charge detector 800 are identical in structure, and may therefore be used interchangeably in a device having such structures.

Figure 9A:
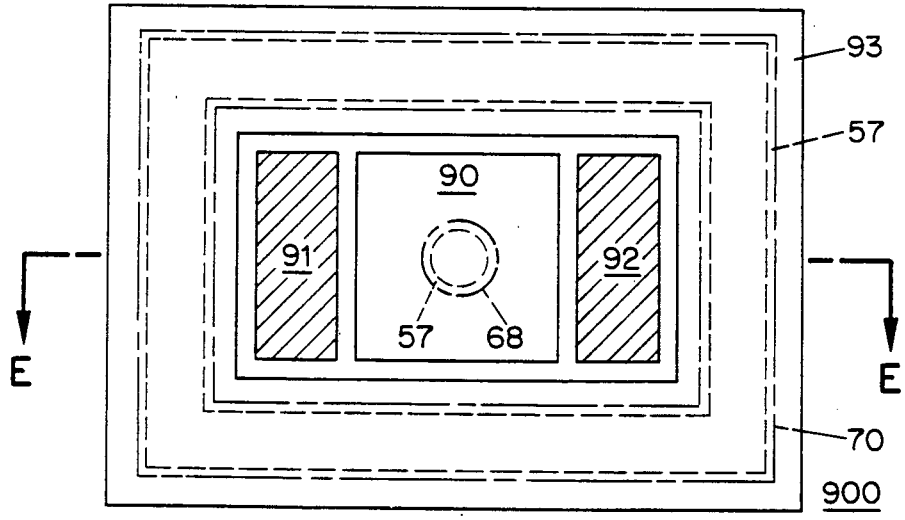
FIG. 9(a) is a plan view of an exemplary trench-defined reset transistor in accordance with the present invention.
Figure 9B:
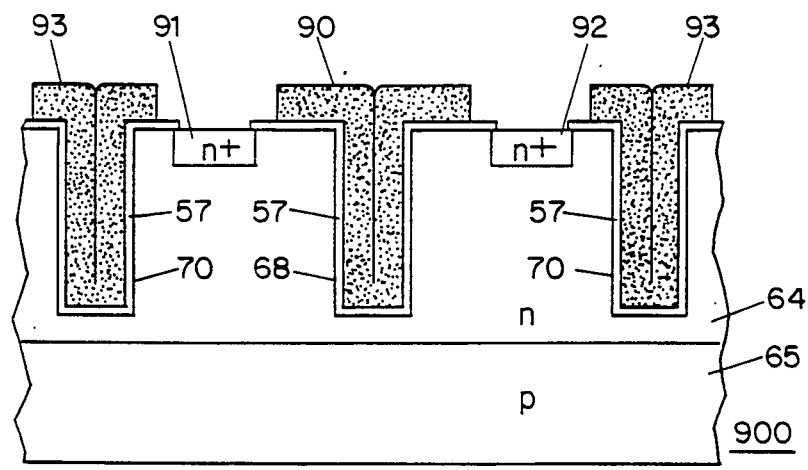
FIG. 9(b) is a cross-sectional view of the trench-defined reset transistor of FIG. 9(a) along section E—E.
Figure 9C:
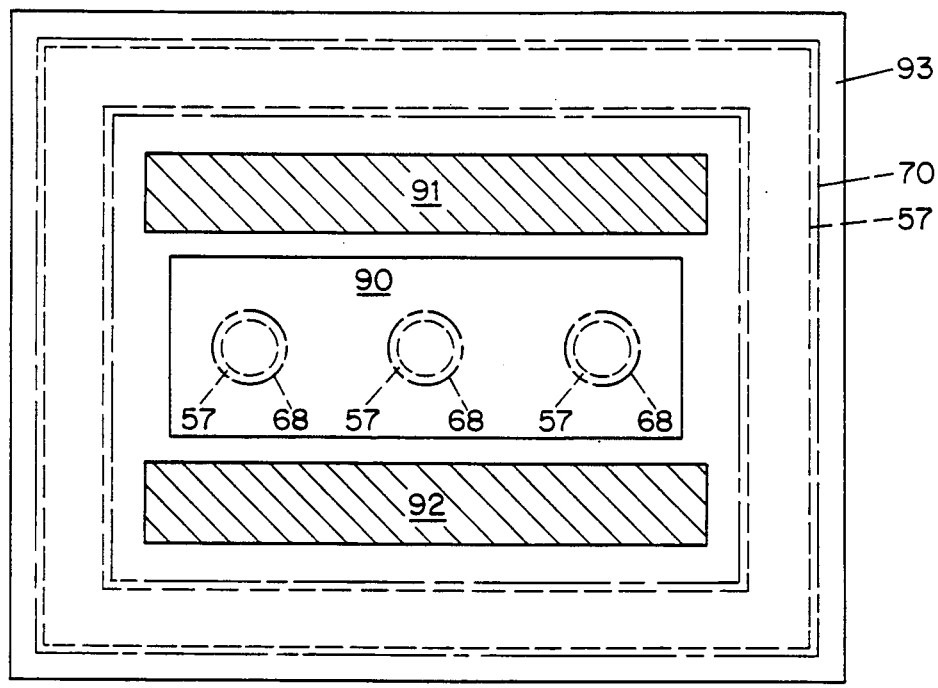
FIG. 9(c) is a plan view of another exemplary trench-defined reset transistor having higher current handling capability in accordance with the present invention.

Referring now to FIGS. 9(a) and 9(b), there are shown plan and sectional views, respectively, of a reset switch transistor 900 implemented in the trench-defined CCD structure in accordance with the invention. The transistor 900 includes an isolation trench 70 which has a relatively thin silicon dioxide layer 57 and a polysilicon electrode 93 formed within it. Relatively heavily doped $n_+$-type contact regions 91 and 92 serve as electron source and drain respectively for the transistor 900, and a trench-defined electrode 90 positioned between the source and drain contact regions 91 and 92 acts as the gate. When electrode 90 is negatively biased by voltage $V_g$ such that the electrostatic potential surrounding the trench of the electrode blocks the flow of carriers between the contact regions 91 and 92, the switch is off. When the bias provided by $V_g$ is changed to be more positive, current is permitted to flow between the source contact 91 and drain contact 92 thereby turning the transistor 900 on. The current carrying capacity of the transistor switch can be increased by providing longer source and drain contact regions 91 and 92, and multiple, linearly-disposed, trench-defined gate electrodes 90 connected together, as shown in FIG. 9(c).

Figure 10:
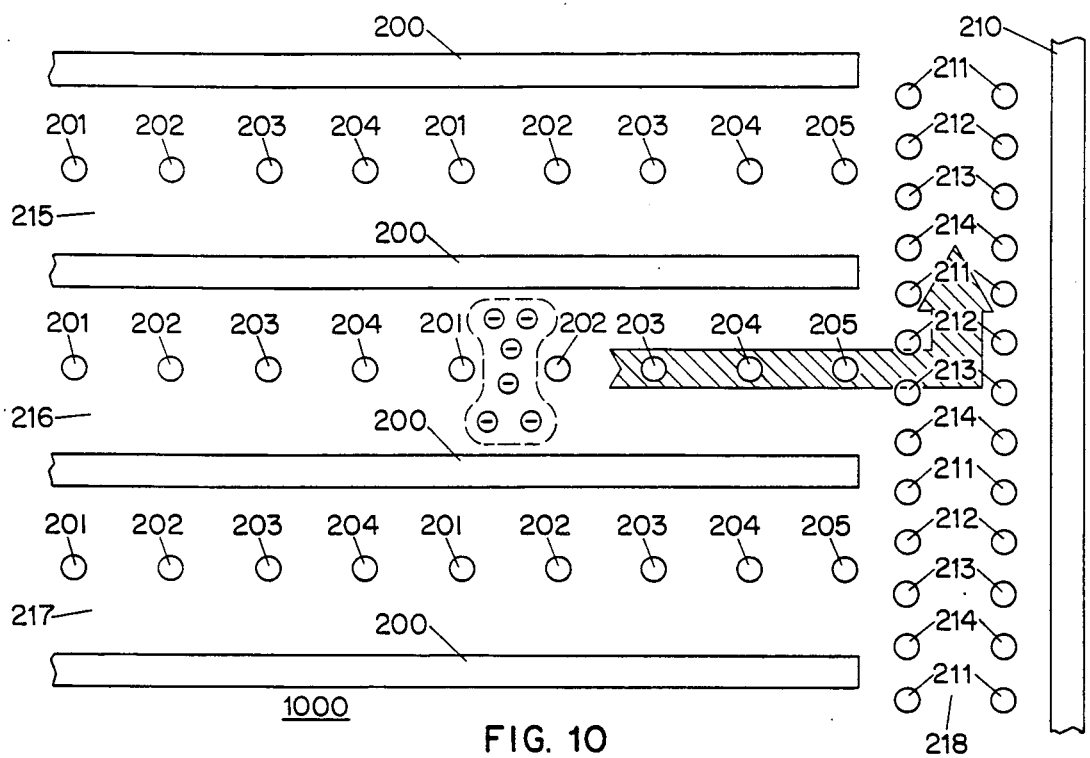
FIG. 10 is a plan view of an exemplary image sensor implemented with the trench-defined CCD structure in accordance with the present invention.

Turning now to FIG. 10, there is a plan view of an exemplary image sensor 1000 in accordance with the invention formed with three trench-defined CCD shift registers 215, 216 and 217. The shift registers, which are disposed in parallel relationship such that the electrodes of one are aligned with corresponding electrodes of the others, each have the structure described above in connection with FIGS. 5(a), 5(b), 6(a) and 6(b). For simplicity of the illustration, only the trench of each trench-defined electrode of the sensor 1000 is depicted in the figure.

Accordingly, the sensor 1000 consists of a regular array of 6 pixels arranged in a 3-column, 2-row format, although it will be understood that a much larger array of pixel regions may be formed. Each pixel is defined by a string of regular, spaced-apart electrodes 201-204 in a particular one of the shift registers 215-217. The long trench-defined electrodes 200 provide isolation of pixels between adjacent columns.

In accordance with four-phase operation, the electrodes in each column are connected to receive the four signal phases $\phi_1$-$\phi_4$ in the manner shown in FIG. 1(a), and electrodes denoted by reference numerals 201-204 receive signal phases $\phi_1$-$\phi_4$, respectively. Operation of the sensor 1000 takes place in alternating exposure and readout intervals. During an exposure interval, electrodes 201-203 of each pixel are biased at a charge-retention voltage, while electrode 204 of the pixel is biased at a charge-repelling voltage isolate pixels in the same column. During a readout interval, the signal phase applied to electrode 203 of each pixel is changed to a charge-repelling voltage to cause containment of the photogenerated charge in a charge storage region between electrodes 201 and 202 of the pixel. The signal voltages on the electrodes of each of the shift registers 215-217 are then clocked in a four-phase manner, as described above, to shift the stored charge in each pixel in the rightward direction toward a serializing multiplexer 218 defined by two parallel, mutually aligned rows of regularly spaced-apart, trench-defined electrodes, and a parallel elongated trench-defined isolation electrode 210. The multiplexer 218 is also operated in a four phase manner with opposing electrodes in the two rows receiving the same signal phase. In the depiction of FIG. 10, electrodes of the multiplexer 218 which receive the same signal phase are denoted by the same reference numeral. The position of the multiplexer 218 in relationship to the shift registers 215-217 of the pixel array, the spacing between adjacent opposing pairs of electrodes, and the signal voltages applied to the electrodes are such that charge storage regions are established by electrodes 212 and 213 at an appropriate time to receive stored charge packets associated with a row of pixels, when the voltages on the charge transfer electrodes 205 change to a charge retention voltage. Once the charge packets associated with a row of pixels are received by the multiplexer 218, they are shifted in the upward direction to a charge detector (not shown) positioned at the upper end of the multiplexer 218. The construction and operation of the charge detector may be as described above in connection with FIGS. 8(a) and 8(b). Advantageously, the serializing multiplexer 218 operates at a much higher speed than the shift registers 215-217 of the pixel array, such that the shifting of the charge packets associated with one row of pixels into the charge detector (not shown) is completed in time for the multiplexer 218 to receive the charge packets associated with the next row of pixels.

Figure 11:
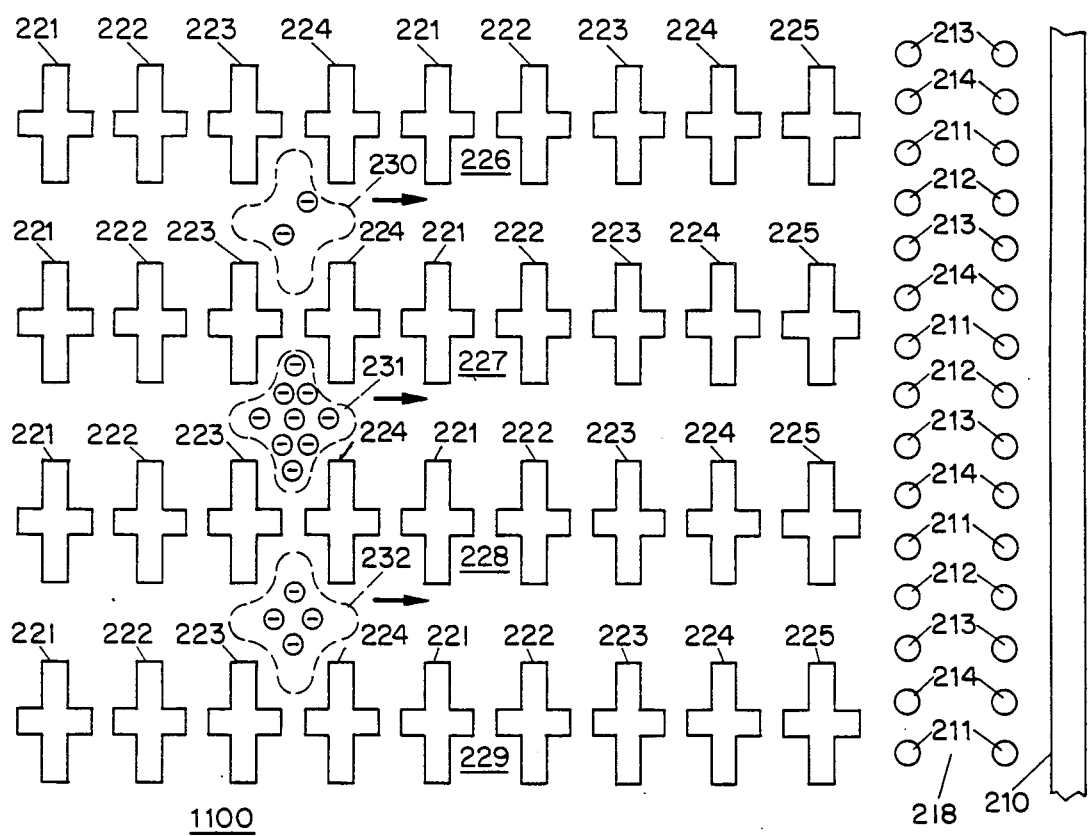
FIG. 11 is a plan view of another exemplary image sensor with higher fill-factor implemented with the trench-defined CCD structure in accordance with the present invention.

Turning now to FIG. 11, there is shown a plan view of an alternative embodiment of an image sensor 1100 which does not require the column isolation electrodes 200 of the image sensor 1000 shown in FIG. 10. Elimination of such column isolation electrodes 200 increases the fill factor of the sensor and thereby increases the effective quantum efficiency.

The image sensor 1100 has a two row by two column array of pixels defined by four parallel, spaced-apart columns 226-229 of trench-defined electrodes. Each of the columns 226-229 has nine linearly disposed, regularly spaced-apart electrodes, and each pixel is defined by four adjacent opposing pairs of electrodes 221-224 with the last electrode 225 of each column serving as a transfer electrode in the same manner as electrode 205 in the image sensor of FIG. 10. Each column of electrodes of the pixel array, except for the outermost columns 226 and 229 is shared by two adjacent columns of pixels.

Each of the electrodes of the pixel array is shaped to have projections extending towards adjacent electrodes in the same column and projections extending towards opposing electrodes in adjacent columns. The spacings between the projections of adjacent electrodes in the same column is relatively small so as to isolate the pixels of one column from the pixels of adjacent columns.

The image sensor 1100 is operated in the same four phase manner as the image sensor of FIG. 10. The electrodes denoted by reference numerals 221-224 receive signal phases $\phi_1$-$\phi_4$, respectively, and the transfer electrodes 225 may receive signal phase $\phi_1$ or a different charge transfer signal. Charge packets, such as those denoted by reference numerals 230-232, associated with each row of pixels are shifted in the rightward direction and transferred to a serializing multiplexer 218 having the same construction and operated in the same manner as the one in the image sensor of FIG. 10. The charge packets received by the multiplexer 218 are serially shifted in the upward direction and received by a charge detector (not shown).

Figure 12:
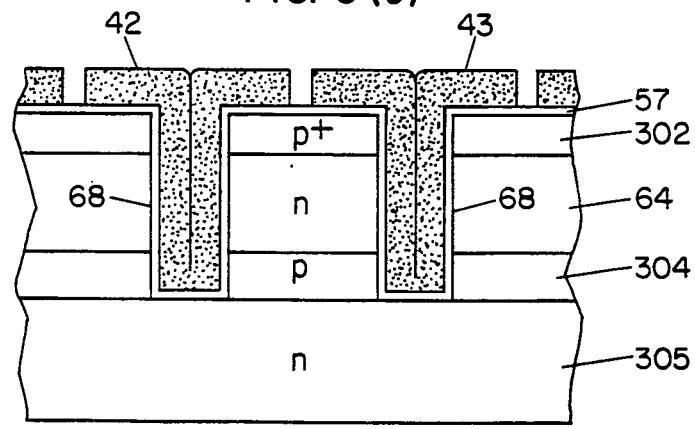
FIG. 12 is a cross-sectional view of a CCD structure which includes an inverting contact and a vertical overflow drain structure.

Referring now to FIG. 12, there is shown a cross-sectional view of a trench-defined CCD structure which includes a relatively thin $p_+$-type inverting contact layer 302 adjacent the surface of the n-type layer 64, and a vertical overflow drain structure comprising a relatively thin p-type layer 304 and an n-type layer 305 interposed between the n-type layer 64 and the substrate. The $p_+$-type contact layer 302 may be omitted if an inverting contact layer is not needed, and the p-type layer 304 and n-type layer 305 may be omitted if a vertical overflow drain structure is not desired.

While the invention has been described in terms of the foregoing specific embodiments thereof, it will be apparent to those skilled in the art that various alterations and modifications may be made to the described embodiments without departing from the scope of the invention, as defined by the appended claims. For example, the trench-defined CCD structure may be formed in a p-type layer on an n-type body region; the trenches may generally have any cross-sectional shape; the insulating layer separating the electrode conductor from the underlying semiconductor may be eliminated by using an appropriate conductor material which forms a schottky barrier contact with the semiconductor; and the semiconductor material used to form the trench-defined CCD may be other than silicon.

We claim:

1. A charge-coupled device comprising:
   a semiconductor layer region of one conductivity type formed on a semiconductive body region of an opposite conductivity type, the semiconductive layer region having an exposed major surface;
   a plurality of spaced-apart trenches of predefined cross-section formed in the major surface of the layer region, each extending from the major surface into the layer region to a predetermined depth;
   a relatively thin insulating layer formed over the major surface and extending into each of the trenches therein so as to cover inner surface of each of the trenches;
   a plurality of electrode layers formed on the insulating layer, covering each of the trenches and extending into the trench covered thereby so as to overlay the insulating layer therein;
   means for applying respective voltage signals to the electrode layers;
   one or more charge detectors, each having a surrounding isolation trench, first and second adjacent trenches formed in the major surface of the layer region to the predetermined depth and being enclosed by the surrounding isolation trench, the insulating layer being formed over the surrounding isolation trench, the first trench and the second trench and extending therein to cover inner surfaces thereof, and respective electrode layers formed on the insulating layer covering the surrounding isolation trench, the first trench and the second trench, the respective electrode layers extending into the isolation trench, the first trench and the second trench so as to overlay the insulating layer therein;

a relatively highly doped diffusion region of the first conductivity type formed in the major surface of the layer region surrounded by the surrounding isolation trench and being adjacent to the first trench;

means for coupling the diffusion region to amplifying means and biasing means; and means for applying respective gating signal voltages to the electrode layers covering the first and the second trench.

2. A charge-coupled device comprising:

a semiconductor layer region of one conductivity type formed on a semiconductive body region of an opposite conductivity type, the semiconductive layer region having an exposed major surface;

a plurality of spaced-apart trenches of predefined cross-section formed in the major surface of the layer region, each extending from the major surface into the layer region to a predetermined depth;

a relatively thin insulating layer formed over the major surface and extending into each of the trenches therein so as to cover inner surface of each of the trenches;

a plurality of electrode layers formed on the insulating layer, covering each of the trenches and extending into the trench covered thereby so as to overlay the insulating layer therein;

means for applying respective voltage signals to the electrode layers;

one or more charge detectors, each having a surrounding isolation trench, first trench and second adjacent trenches formed in the major surface of the layer region to the predetermined depth and being enclosed by the surrounding isolation trench, the insulating layer being formed over the surrounding isolation trench, the first trench and the second trench and extending therein to cover inner surfaces thereof, and respective electrode layers formed on the insulating layer covering the surrounding isolation trench, the first trench and the second trench and extending into each of the surrounding isolation trench, the first trench and the second trench so as to overlay the insulating layer therein;

a relatively highly doped diffusion region of the first conductivity type formed in the major surface of the layer region surrounded by the surrounding isolation trench and positioned adjacent to the first trench;

means for coupling the injection region to biasing means; and means for applying respective gating signal voltages to the electrode layers covering the first and the second trenches.

3. A charge-coupled device comprising:

a semiconductor layer region of one conductivity type formed on a semiconductive body region of an opposite conductive type, the semiconductive layer region having an exposed major surface;

one or more spaced-apart trenches of predefined cross-section formed in the major surface of the layer region, each extending from the major surface into the layer region to a predetermined depth;

first and second relatively highly doped regions of the first conductivity type formed in the major surface of the layer region, one on each side of the one ore more trenches;

an isolation trench formed in the major surface of the layer region extending from the major surface into the layer region to the predetermined depth, the isolation trench surrounding the one or more trenches and the first and second regions;

a relatively thin insulating layer formed over the major surface and extending into each of the one or more trenches and the isolation trench therein so as to cover inner surfaces of the one or more trenches and the isolation trench;

a plurality of electrode layers formed on the insulating layer, covering each of the one or more trenches and the isolation trench, each electrode layer extending into each of the trenches covered thereby so as to overlay the insulating layer therein;

means for providing electrical contact to each of the first and second regions; and means for applying respective voltage signals to the electrode layers covering the one or more trenches and the isolation trench, and to the means for providing electrical contact to the first and second regions.

4. A charge-coupled device comprising:

a semiconductor layer region of one conductivity type formed on a semiconductive body region of an opposite conductivity type, the semiconductive layer region having an exposed major surface;

a first intermediate layer region of the opposite conductivity type interposed between the layer region and the body region;

a second intermediate layer region of the one conductivity type interposed between the first intermediate layer region and body region;

a plurality of spaced-apart trenches of predefined cross-section formed in the major surface of the layer region, each extending from the major surface into at least the first intermediate layer region;

a relatively thin insulating layer formed over the major surface and extending into each of the trenches therein so as to cover inner surface of each of the trenches;

a plurality of electrode layers formed on the insulating layer, covering each of the trenches and extending into the trench covered thereby so as to overlay the insulating layer therein; and means for applying respective voltage signals to the electrode layers.

5. A charge-coupled device comprising:

a semiconductor layer region of one conductivity type formed on a semiconductive body region of an opposite conductivity type, the semiconductive layer region having an exposed major surface;

a plurality of spaced-apart trenches of predefined cross-section formed in the major surface of the layer region and disposed in a regularly spaced linear array including a first trench, a second trench adjacent to the first trench, a third trench adjacent to the second trench, a fourth trench adjacent to the third trench and a fifth trench adjacent to the fourth trench, each spaced-apart trench extending from the major surface into the layer region to a predetermined depth;

a relatively thin insulating layer formed over the major surface and extending into each of the trenches therein so as to cover inner surface of each of the trenches;

a plurality of electrode layers formed on the insulating layer, covering each of the trenches and extending into the trench covered thereby so as to overlay the insulating layer therein;

first and second isolation trenches formed in the major surface of the layer region to the predetermined depth, each of the first and second isolation trenches extending along a respective side of the linear array and spaced-apart therefrom, the insulating layer being formed over the first and second isolation trenches and extending therein to cover inner surfaces thereof, and one or more electrode layers formed on the insulating layer covering the first and second isolation trenches, the electrode layer or layers extending into the first and second isolation trenches so as to overlay the insulating layer therein; and means for applying respective voltage signals to the electrode layers including means for successively establishing a first charge storage potential region in the layer region between the first and the second trench, a second charge storage potential region in the layer region between the second and the third trench, a third charge storage potential region in the layer region between the third and the fourth trench and a fourth charge storage potential region in the layer region between the fourth and the fifth trench, and wherein a charge packet initially stored in the first charge storage potential region is successively shifted to the second, the third and the fourth charge storage potential regions.

6. The charge-coupled device of claim 5, wherein the means for establishing the first, second, third and fourth charge storage potential regions include means for applying a charge-retention voltage to the electrode layers covering the first, the second and the fifth trench, and a charge-repulsion voltage to the electrode layers covering the third and the fourth trench, then applying the charge-retention voltage to the electrode layers covering the second and the third trench, and the charge-repulsion voltage to the electrode layers covering the first, the fourth and the fifth trench, then applying the charge-retention voltage to the electrode layers covering the third and the fourth trench, and the charge-repulsion voltage to the electrode layers covering the first, the second and the fifth trench, and thereafter applying the charge-retention voltage to the electrode layers covering the fourth and the fifth trench, and the charge-repulsion voltage to the electrode layers covering the first, the second and the third trench, while maintaining a charge-repulsion isolation voltage to the electrode layer or layers covering the first and the second isolation trench.

7. A charge-coupled device comprising:

a semiconductor layer region of one conductivity type formed on a semiconductive body region of an opposite conductivity type, the semiconductive layer region having an exposed major surface;

a plurality of spaced-apart trenches of predefined cross-section formed in the major surface of the layer region, each extending from the major surface into the layer region to a predetermined depth, the plurality of spread-apart trenches being disposed in a pixel array having a plurality of regularly spaced rows and regularly spaced columns, and a multiplexer array comprising two parallel, mutually-aligned, regularly-spaced linear arrays perpendicularly positioned with respect to the columns of the pixel array and spaced-apart therefrom by a predetermined spacing, the linear arrays being at least coextensive with the rows of the pixel array;

a relatively thin insulating layer formed over the major surface and extending into each of the trenches therein so as to cover inner surface of each of the trenches;

a plurality of electrode layers formed on the insulating layer, covering each of the trenches and extending into the trench covered thereby so as to overlay the insulating layer therein;

means for applying voltage signals to the electrode layers covering the trenches of the pixel array for establishing a plurality of rows and a plurality of columns of charge storage potential regions for storage of photogenerated charge packets during a readout interval; and means for applying voltage signals to the electrode layers covering the trenches of the multiplexer array for establishing a plurality of charge storage potential regions each for receiving a charge packet from a corresponding one of the columns of charge packets being shifted towards the multiplexer array, and for shifting charge packets received in the charge storage potential regions at a relatively high rate to a charge detector.

8. The charge-coupled device of claim 7, wherein the plurality of trenches further comprises a plurality of first isolation trenches and a second isolation trench, the first trenches each having a relatively narrow width and a length at least coextensive with the columns of electrodes of the pixel array and being disposed one on each side of each column of electrodes of the pixel array, the second isolation trench having a relatively narrow width and a length at least coextensive with the linear arrays of electrodes of the multiplexer array and being disposed in parallel along a side of the multiplexer array away from the pixel array, and the means for applying repsective voltage signals to the electrode layers include means for applying a biased voltage to the electrode layers covering each of the first isolation trenches and the second isolation trench, and wherein each of the charge storage potential regions for storage of photogenerated charge packets are established in the layer region between particular adjacent pairs of electrodes in each column of electrodes of the pixel array.

9. A charge-coupled device of claim 7, wherein each of the electrodes of the pixel array is formed with a cross sectional shape having first projections extending towards adjacent electrodes in a column of the pixel array and second projections extending towards adjacent electrodes in a row of the pixel array, the spacing between the first projections of adjacent electrodes of a column of the pixel array being sufficiently small to provide charge isolation between portions of the layer region on each side of the column, and wherein the charge storage potential regions for storage of photogenerated charge packets are established in the layer region surrounded by particular groups of four adjacent electrodes between each pair of columns of the pixel array.

* * * * *

UNITED STATES PATENT AND TRADEMARK OFFICE
CERTIFICATE OF CORRECTION

PATENT NO. : 5,055,900
DATED : October 8, 1991
INVENTOR(S) : Eric R. Fossum et al.

It is certified that error appears in the above-identified patent and that said Letters Patent is hereby corrected as shown below:

Title page, 6th from bottom line of ABSTRACT, "over a" should read -- over --. Col. 2, line 5, "shall" should read -- small --. Col 3, line 11, "semiconductor" should read -- semiconductor material. Because the charge storage regions are formed --. Col. 5, line 30, "40'" should read -- 40" --. Col. 6, line 26, "regions" should read -- region --; line 47, "electrodes" should read -- electrode --. Col. 7, line 53, "6(b)" should read -- 8(b) --. Col. 9, line 2, "isolate" should read -- to isolate --. Col. 10, line 53, "surface" should read -- surfaces --. Col. 11, line 29, "surface" should read -- surfaces --; line 37, "detectors" should read -- sources --; line 49, "trench" should read -- trenches --; line 52, "diffusion" should read -- injection --; line 54, "surrounded" should read -- enclosed --. Col. 12, line 6, "ore" should read -- or --; line 48, "surface" should read -- surfaces --. Col. 13, line 5, "surface" should read -- surfaces --. Col. 14, line 12, "surface" should read -- surfaces --; line 22, "during" should read -- during an exposure interval and for shifting columns of photogenerated charge packets towards the multiplexer array during --; line 45, "repsective" should read -- respective --.

Signed and Sealed this

Eleventh Day of January, 1994

*Attest:*

BRUCE LEHMAN

*Attesting Officer*    Commissioner of Patents and Trademarks